United States Patent
Sasaki

(10) Patent No.: US 10,886,910 B2
(45) Date of Patent: Jan. 5, 2021

(54) SEMICONDUCTOR DEVICE WITH CURRENT SENSE ELEMENT

(71) Applicant: FUJI ELECTRIC CO., LTD., Kawasaki (JP)

(72) Inventor: Masahiro Sasaki, Azumino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 67 days.

(21) Appl. No.: 16/428,000

(22) Filed: May 31, 2019

(65) Prior Publication Data

US 2020/0028505 A1 Jan. 23, 2020

(30) Foreign Application Priority Data

Jul. 18, 2018 (JP) ................................. 2018-134655

(51) Int. Cl.
*H03K 17/082* (2006.01)
*H02H 3/10* (2006.01)
*H01L 29/739* (2006.01)

(52) U.S. Cl.
CPC ..... *H03K 17/0826* (2013.01); *H01L 29/7393* (2013.01); *H02H 3/10* (2013.01); *H03K 2217/0027* (2013.01)

(58) Field of Classification Search
CPC ........ H03K 17/0826; H03K 2217/0027; H01L 29/7393; H02H 3/10
See application file for complete search history.

(56) References Cited

U.S. PATENT DOCUMENTS

| | | | | |
|---|---|---|---|---|
| 5,375,029 A * | 12/1994 | Fukunaga | ................ | G05F 1/573 323/285 |
| 5,635,823 A * | 6/1997 | Murakami | ......... | H03K 17/0822 323/277 |
| 5,729,032 A | 3/1998 | Tomomatsu et al. | | |
| 6,147,368 A * | 11/2000 | Kon | ........................ | H01L 24/72 257/146 |
| 6,194,884 B1 * | 2/2001 | Kesler | ...................... | G05F 3/222 323/285 |
| 2001/0007252 A1 * | 7/2001 | Ito | .......................... | F02P 3/0554 123/630 |
| 2007/0194828 A1 * | 8/2007 | Patti | ..................... | H03K 17/567 327/202 |

(Continued)

FOREIGN PATENT DOCUMENTS

JP H07-240516 A 9/1995
JP 2002-033647 A 1/2002

*Primary Examiner* — Adolf D Berhane
*Assistant Examiner* — Kevin H Sprenger
(74) *Attorney, Agent, or Firm* — Rabin & Berdo, P.C.

(57) ABSTRACT

A semiconductor device, including a main switching element having a gate terminal and an emitter terminal, a sense switching element connected to the main switching element for detecting a current flowing through the main switching element, and a voltage division circuit connected between the gate terminal and the emitter terminal of the main switching element. The voltage division circuit includes a first resistor and a second resistor connected in series. A connection point of the first resistor and the second resistor is connected to the sense switching element, so that a voltage applied to the gate terminal of the main switching element is divided by the voltage division circuit, and a portion of the voltage is applied to the sense switching element.

5 Claims, 6 Drawing Sheets

(56) References Cited

U.S. PATENT DOCUMENTS

| | | | | |
|---|---|---|---|---|
| 2012/0280728 | A1* | 11/2012 | Hussein | H03K 17/168 |
| | | | | 327/155 |
| 2013/0060499 | A1* | 3/2013 | Yoshimura | G01K 15/005 |
| | | | | 702/99 |
| 2015/0060940 | A1* | 3/2015 | Muto | H01L 25/165 |
| | | | | 257/140 |
| 2015/0325558 | A1* | 11/2015 | Hikasa | H01L 24/06 |
| | | | | 257/49 |
| 2016/0043713 | A1* | 2/2016 | Okuda | H03K 17/567 |
| | | | | 327/432 |

* cited by examiner

SEMICONDUCTOR DEVICE WITH CURRENT SENSE ELEMENT

CROSS-REFERENCE TO RELATED APPLICATION

This application is based upon and claims the benefit of priority of the prior Japanese Patent Application No. 2018-134655, filed on Jul. 18, 2018, the entire contents of which are incorporated herein by reference.

BACKGROUND OF THE INVENTION

1. Field of the Invention

The embodiment discussed herein is related to a semiconductor device including on the same semiconductor substrate a main switching element through which a main current flows and a sense switching element used for indirectly detecting the current flowing through the main switching element.

2. Background of the Related Art

Semiconductor devices referred to as intelligent power modules (IPMs) are used in power converters such as inverter units for driving a motor and DC-DC converter units. With the IPMs a power semiconductor element and a control integrated circuit (IC) incorporating a drive circuit for driving the power semiconductor element and a protective circuit for protecting the power semiconductor element are included in the same package. This contributes to miniaturization of power converters. An insulated gate bipolar transistor (IGBT), a metal oxide semiconductor field effect transistor (MOSFET), or the like is used as the power semiconductor element.

With the IPMs a current flowing through the power semiconductor element is detected in order that control is exercised for supplying a proper current from the power semiconductor element to a load or that the power semiconductor element is protected against an overcurrent. In order to detect a current flowing through the power semiconductor element, usually the following method is adopted (see, for example, Japanese Laid-open Patent Publication No. 2002-33647). A main switching element and a sense switching element are connected in parallel and a current flowing through the sense switching element is detected. By doing so, a current flowing through the main switching element is estimated. With an IGBT disclosed in Japanese Laid-open Patent Publication No. 2002-33647, for example, a current sense resistor is connected to an emitter terminal of the sense switching element (sense IGBT) and a voltage generated across the current sense resistor is detected. By doing so, a current flowing through the main switching element (main IGBT) is detected indirectly.

FIG. 4 is a circuit diagram illustrative of an IGBT having a structure for current detection.

An IGBT 100 illustrated in FIG. 4 is a composite element including a main IGBT 101 through which a main current flows and a sense IGBT 102 used for detecting the current flowing through the main IGBT 101. A collector terminal C of the IGBT 100 is connected to collector terminals of the main IGBT 101 and the sense IGBT 102. A gate terminal G of the IGBT 100 is connected to gate terminals of the main IGBT 101 and the sense IGBT 102. An emitter terminal of the main IGBT 101 is connected to an emitter terminal E of the IGBT 100. An emitter terminal of the sense IGBT 102 is connected to a sense emitter terminal SE of the IGBT 100.

The main IGBT 101 and the sense IGBT 102 which make up the IGBT 100 are formed on the same semiconductor substrate at a determined area ratio (m:1). A current flowing through the main IGBT 101 and a current flowing through the sense IGBT 102 are determined by the area ratio between the main IGBT 101 and the sense IGBT 102. Therefore, a current m times a current flowing through the sense IGBT 102 flows through the main IGBT 101.

FIG. 5 illustrates a first example of a circuit in which a sense IGBT is used for detecting an overcurrent and a short-circuit current of a main IGBT. FIG. 6 illustrates a second example of a circuit in which a sense IGBT is used for detecting an overcurrent and a short-circuit current of a main IGBT. Components in FIG. 5 or FIG. 6 which are the same as or equivalent to those illustrated in FIG. 4 are marked with the same numerals and detailed descriptions of them will be omitted. With an IGBT 100 illustrated in FIG. 5 or FIG. 6, a main IGBT and a sense IGBT are indicated by one IGBT symbol and an emitter terminal E of the main IGBT and a sense emitter terminal SE of the sense IGBT are indicated separately.

According to the first example illustrated in FIG. 5, the sense emitter terminal SE of the sense IGBT is connected to one terminal of a current sense resistor Rs1 and the other terminal of the current sense resistor Rs1 is connected to one terminal of a current sense resistor Rs2. The other terminal of the current sense resistor Rs2 is connected to the emitter terminal E of the main IGBT. The connection portion of the current sense resistor Rs1 and the current sense resistor Rs2 is connected to a non-inverting input terminal of a short-circuit current detection comparator 103. Furthermore, the sense emitter terminal SE of the sense IGBT is connected to a non-inverting input terminal of an overcurrent detection comparator 104. Inverting input terminals of the short-circuit current detection comparator 103 and the overcurrent detection comparator 104 are connected to a positive electrode terminal of a reference voltage source 105. A negative electrode terminal of the reference voltage source 105 is connected to the emitter terminal E of the main IGBT. The reference voltage source 105 applies a reference voltage Vref to the inverting input terminals of the short-circuit current detection comparator 103 and the overcurrent detection comparator 104.

When the IGBT 100 is turned on, a sense current Is outputted from the sense emitter terminal SE of the sense IGBT flows to the emitter terminal E of the main IGBT via the current sense resistor Rs1 and the current sense resistor Rs2 connected in series. At this time a collector current Ic flows from the emitter terminal E of the main IGBT of the IGBT 100.

The sense current Is flows through the current sense resistor Rs1 and the current sense resistor Rs2. Accordingly, a drop in voltage occurs across the current sense resistor Rs1 or the current sense resistor Rs2. As a result, a voltage Voc obtained by converting the sense current Is to a voltage signal is applied to the non-inverting input terminal of the overcurrent detection comparator 104 and a voltage Vsc obtained by dividing the voltage Voc by the current sense resistor Rs1 and the current sense resistor Rs2 is applied to the non-inverting input terminal of the short-circuit current detection comparator 103.

The overcurrent detection comparator 104 compares the voltage Voc and the reference voltage Vref. When the voltage Voc exceeds the reference voltage Vref, the overcurrent detection comparator 104 detects an overcurrent and outputs an overcurrent signal OC. The short-circuit current detection comparator 103 compares the voltage Vsc and the reference voltage Vref. When the voltage Vsc exceeds the reference voltage Vref, the short-circuit current detection comparator 103 detects a short-circuit current and outputs a short-circuit current signal SC.

According to the second example illustrated in FIG. 6, the sense emitter terminal SE of the sense IGBT is connected to one terminal of a current sense resistor Rs and the other terminal of the current sense resistor Rs is connected to the emitter terminal E of the main IGBT. Furthermore, the sense emitter terminal SE of the sense IGBT is connected to non-inverting input terminals of a short-circuit current detection comparator 103 and an overcurrent detection comparator 104. An inverting input terminal of the short-circuit current detection comparator 103 is connected to a positive electrode terminal of a reference voltage source 105. A negative electrode terminal of the reference voltage source 105 is connected to the emitter terminal E of the main IGBT. The reference voltage source 105 applies a reference voltage Vref1 corresponding to a short-circuit current detection level to the inverting input terminal of the short-circuit current detection comparator 103. An inverting input terminal of the overcurrent detection comparator 104 is connected to a positive electrode terminal of a reference voltage source 106. A negative electrode terminal of the reference voltage source 106 is connected to the emitter terminal E of the main IGBT. The reference voltage source 106 applies a reference voltage Vref2 corresponding to an overcurrent detection level to the inverting input terminal of the overcurrent detection comparator 104. The short-circuit current detection level is set higher than the overcurrent detection level.

When the IGBT 100 is turned on, a sense current Is outputted from the sense emitter terminal SE of the sense IGBT flows to the emitter terminal E of the main IGBT via the current sense resistor Rs. At this time a collector current Ic flows from the emitter terminal E of the main IGBT of the IGBT 100.

The sense current Is flows through the current sense resistor Rs. Accordingly, a drop in voltage occurs across the current sense resistor Rs. As a result, a voltage Vs obtained by converting the sense current Is to a voltage signal is applied to the non-inverting input terminals of the short-circuit current detection comparator 103 and the overcurrent detection comparator 104.

The short-circuit current detection comparator 103 compares the voltage Vs and the reference voltage Vref1. When the voltage Vs exceeds the reference voltage Vref1, the short-circuit current detection comparator 103 detects a short-circuit current and outputs a short-circuit current signal SC. The overcurrent detection comparator 104 compares the voltage Vs and the reference voltage Vref2. When the voltage Vs exceeds the reference voltage Vref2, the overcurrent detection comparator 104 detects an overcurrent and outputs an overcurrent signal OC.

The short-circuit current signal SC and the overcurrent signal OC outputted by the short-circuit current detection comparator 103 and the overcurrent detection comparator 104 respectively are supplied to a protective circuit of a control IC. By forcedly turning off the IGBT 100, for example, a measure to protect the IGBT 100 is taken.

It is assumed that a semiconductor device is made up of a main IGBT and a sense IGBT connected in parallel. Ideally, a main current and a sense current begin to flow at the same timing when the same gate signal is inputted to gate terminals of the main IGBT and the sense IGBT. However, a current sense resistor is connected to the sense IGBT. As a result, a threshold voltage at which a current really begins to flow differs from the threshold voltage of the main IGBT. In addition, the main IGBT and the sense IGBT excessively differ in size. As a result, the main IGBT and the sense IGBT differ in the parasitic capacitance of gate terminal (gate-emitter capacitance and gate-collector capacitance). This leads to unbalance between the characteristics of the main IGBT and the sense IGBT.

If there is unbalance between the characteristics of the main IGBT and the sense IGBT, a surge current may flow at the time of the rising of a current of the sense IGBT in a turn-on period of an IGBT 100. Before a collector current Ic of the main IGBT rises, this surge current is superimposed on a sense current of the sense IGBT and a transient current flows. That is to say, a transient sense current flows. As a result, current concentration occurs in the sense IGBT of the IGBT 100. At this time a short-circuit current detection comparator 103 detects a short-circuit current and outputs a short-circuit current signal SC. Accordingly, a short-circuit protection circuit malfunctions in a control IC which receives the short-circuit current signal SC.

Preventing a surge current from flowing at the time of the rising of a current of a sense IGBT makes it possible to prevent the malfunction of a short-circuit protection circuit (see, for example, Japanese Laid-open Patent Publication No. H07-240516). With an IGBT disclosed in Japanese Laid-open Patent Publication No. H07-240516, for example, the following structure is adopted. The gate resistance of a sense IGBT is higher than that of a main IGBT so that the gate threshold voltage of the sense IGBT will be higher than that of the main IGBT. As a result, the rising of a current of the sense IGBT is later than that of a current of the main IGBT. Therefore, a surge current does not flow at the time of the rising of a current of the sense IGBT. This prevents the malfunction of the short-circuit protection circuit caused by an overcurrent.

However, if the rising of a current of the sense IGBT is made later than that of a current of the main IGBT, then there is a possibility that detection of a short-circuit current of the main IGBT turned on earlier than the sense IGBT becomes later. This problem also arises in a transitional period in which the IGBT is turned off. That is to say, when the IGBT is turned off, the falling of a current of the sense IGBT is earlier than that of a current of the main IGBT. As a result, a short-circuit current of the main IGBT which remains in an on state is not detected.

SUMMARY OF THE INVENTION

According to an aspect, there is provided a semiconductor device including a main switching element having a gate terminal and an emitter terminal; a sense switching element connected to the main switching element for detecting a current flowing through the main switching element; and a voltage division circuit connected between the gate terminal and the emitter terminal of the main switching element, the voltage division circuit including a first resistor and a second resistor connected in series, wherein a connection point of the first resistor and the second resistor is connected to the sense switching element, so that a voltage applied to the gate terminal of the main switching element is divided by the voltage division circuit, and a portion of the voltage is applied to the sense switching element.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will now be described in detail with reference to the accompanying drawings with an IGBT having a main IGBT and a sense IGBT as an example. Components in the figures indicated by the same numerals are the same.

Figure 1:
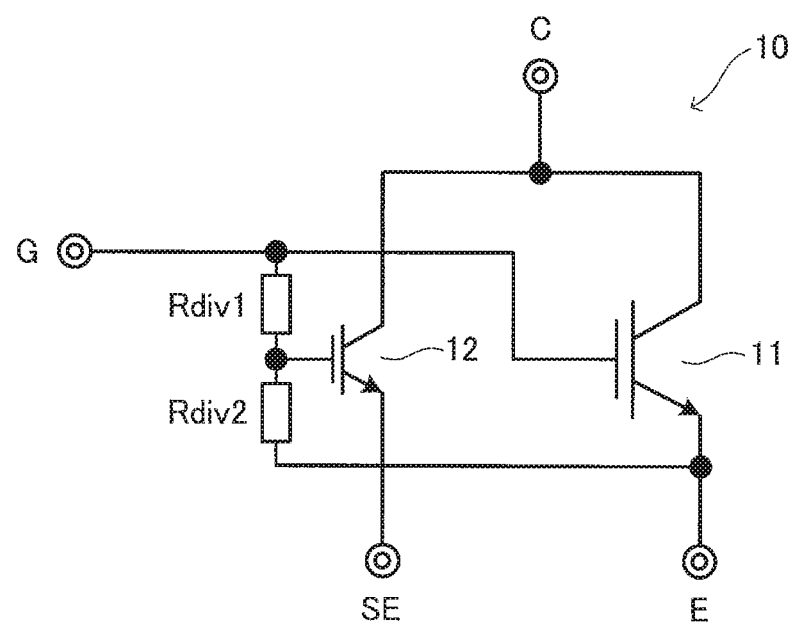
FIG. 1 is a circuit diagram illustrative of an IGBT according to an embodiment.

FIG. 1 is a circuit diagram illustrative of an IGBT according to an embodiment.

An IGBT 10 illustrated in FIG. 1 is a composite element including a main IGBT 11 through which a main current flows and a sense IGBT 12 used for indirectly detecting the current flowing through the main IGBT 11. A collector terminal C of the IGBT 10 is connected to collector terminals of the main IGBT 11 and the sense IGBT 12. A gate terminal G of the IGBT 10 is connected to a gate terminal of the main IGBT 11 and one terminal of a voltage division resistor Rdiv1. The other terminal of the voltage division resistor Rdiv1 is connected to one terminal of a voltage division resistor Rdiv2 and a gate terminal of the sense IGBT 12. The other terminal of the voltage division resistor Rdiv2 is connected to an emitter terminal of the main IGBT 11. The emitter terminal of the main IGBT 11 is connected to an emitter terminal E of the IGBT 10. An emitter terminal of the sense IGBT 12 is connected to a sense emitter terminal SE of the IGBT 10. As a result, a voltage obtained by dividing a gate voltage applied to the gate terminal of the main IGBT 11 by a voltage division circuit made up of the voltage division resistors Rdiv1 and Rdiv2 is applied to the gate terminal of the sense IGBT 12.

The main IGBT 11 and the sense IGBT 12 which make up the IGBT 10 are formed on the same semiconductor substrate. The voltage division resistors Rdiv1 and Rdiv2 are formed by the use of polycrystalline silicon on the semiconductor substrate on which the main IGBT 11 and the sense IGBT 12 are formed.

With the IGBT 10 a gate voltage applied to the gate terminal G of the IGBT 10 is supplied directly to the gate terminal of the main IGBT 11. A voltage obtained by dividing the gate voltage by the voltage division resistors Rdiv1 and Rdiv2 is supplied to the gate terminal of the sense IGBT 12. That is to say, a gate voltage of the sense IGBT 12 is determined by $$(Rdiv2/(Rdiv1+Rdiv2))*Vge,$$

where Vge is a gate voltage and the resistance values of the voltage division resistors Rdiv1 and Rdiv2 are Rdiv1 and Rdiv2 respectively. A voltage applied to the gate terminal of the sense IGBT 12 is made lower than a voltage applied to the gate terminal of the main IGBT 11. As a result, the rising of a current of the sense IGBT 12 is later than the rising of a current of the main IGBT 11. Therefore, the rising of a current of the sense IGBT 12 is not earlier than the rising of a current of the main IGBT 11. That is to say, current concentration does not occur in the sense IGBT 12. This suppresses a transient sense current.

A delay in the rising of a current of the sense IGBT 12 is set by a voltage division ratio determined by the resistance values of the voltage division resistors Rdiv1 and Rdiv2. There are considerable errors between the resistance values and design values of the voltage division resistors Rdiv1 and Rdiv2. Therefore, really an adjustment is made so that the rising of a current of the sense IGBT 12 will match the rising of a current of the main IGBT 11. This adjustment is made accurately by the use of a trimming technique. For example, laser trimming is performed on one or both of the voltage division resistors Rdiv1 and Rdiv2.

The timing of the rising of a current of the sense IGBT 12 is made to match the timing of the rising of a current of the main IGBT 11. By doing so, a short-circuit current of the main IGBT 11 is detected by the sense IGBT 12 in real time without delay. As a result, there is no need to set a certain dead period (mask period) which was set for preventing misdetection caused by a transient sense current. Furthermore, there is no need to increase the tolerance (size) of an IGBT chip during the dead period. Because there is no need to set the mask period, a tolerance margin is reduced and the size of an IGBT chip is reduced. As a result, a small low-cost IGBT 10 is provided.

Figure 5:
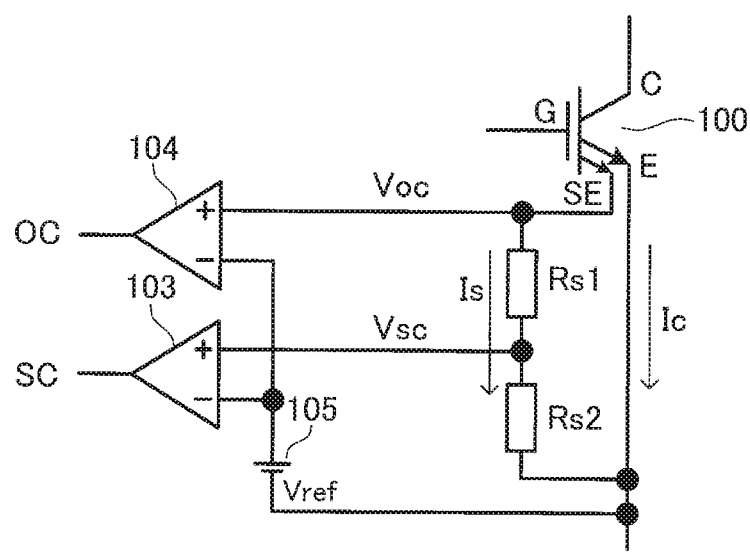
FIG. 5 illustrates a first example of a circuit in which a sense IGBT is used for detecting an overcurrent and a short-circuit current of a main IGBT.
Figure 6:
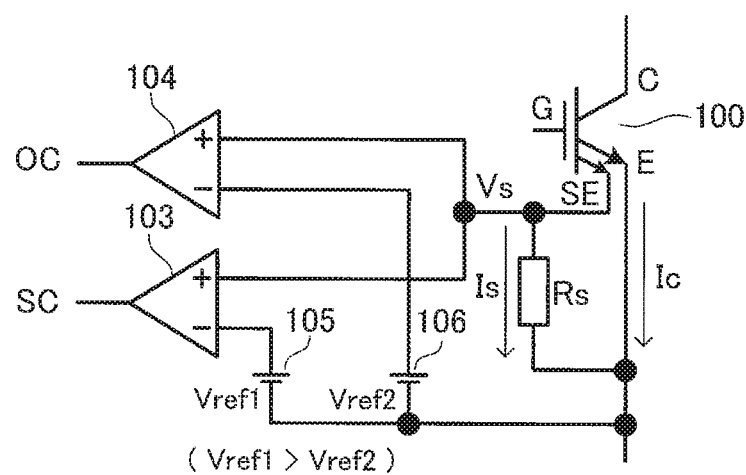
FIG. 6 illustrates a second example of a circuit in which a sense IGBT is used for detecting an overcurrent and a short-circuit current of a main IGBT.

As illustrated in FIG. 5 or FIG. 6, an overcurrent and a short-circuit current of the IGBT 10 are detected by the use of a current sense resistor, a short-circuit current detection comparator, and overcurrent detection comparator connected to the sense emitter terminal SE and a reference voltage source.

Figure 2:
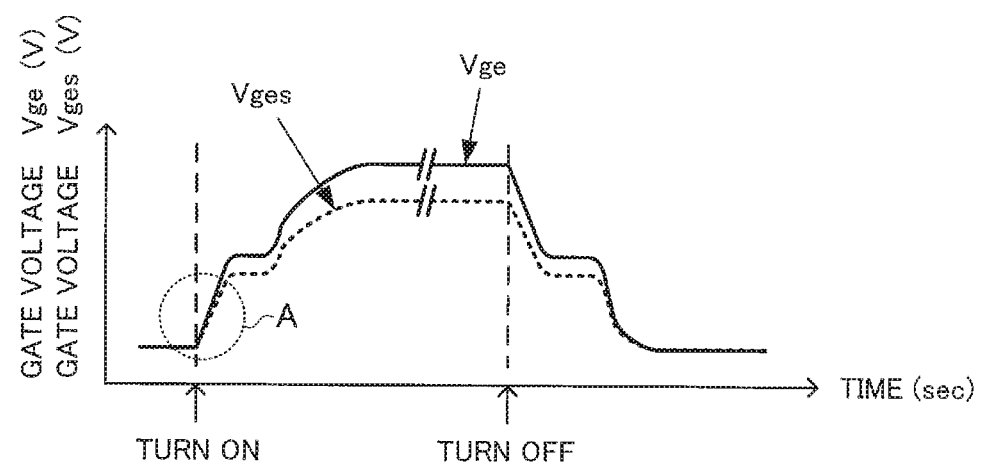
FIG. 2 illustrates gate voltage waveforms of a main IGBT and a sense IGBT which make up the IGBT according to the embodiment.
Figure 3:
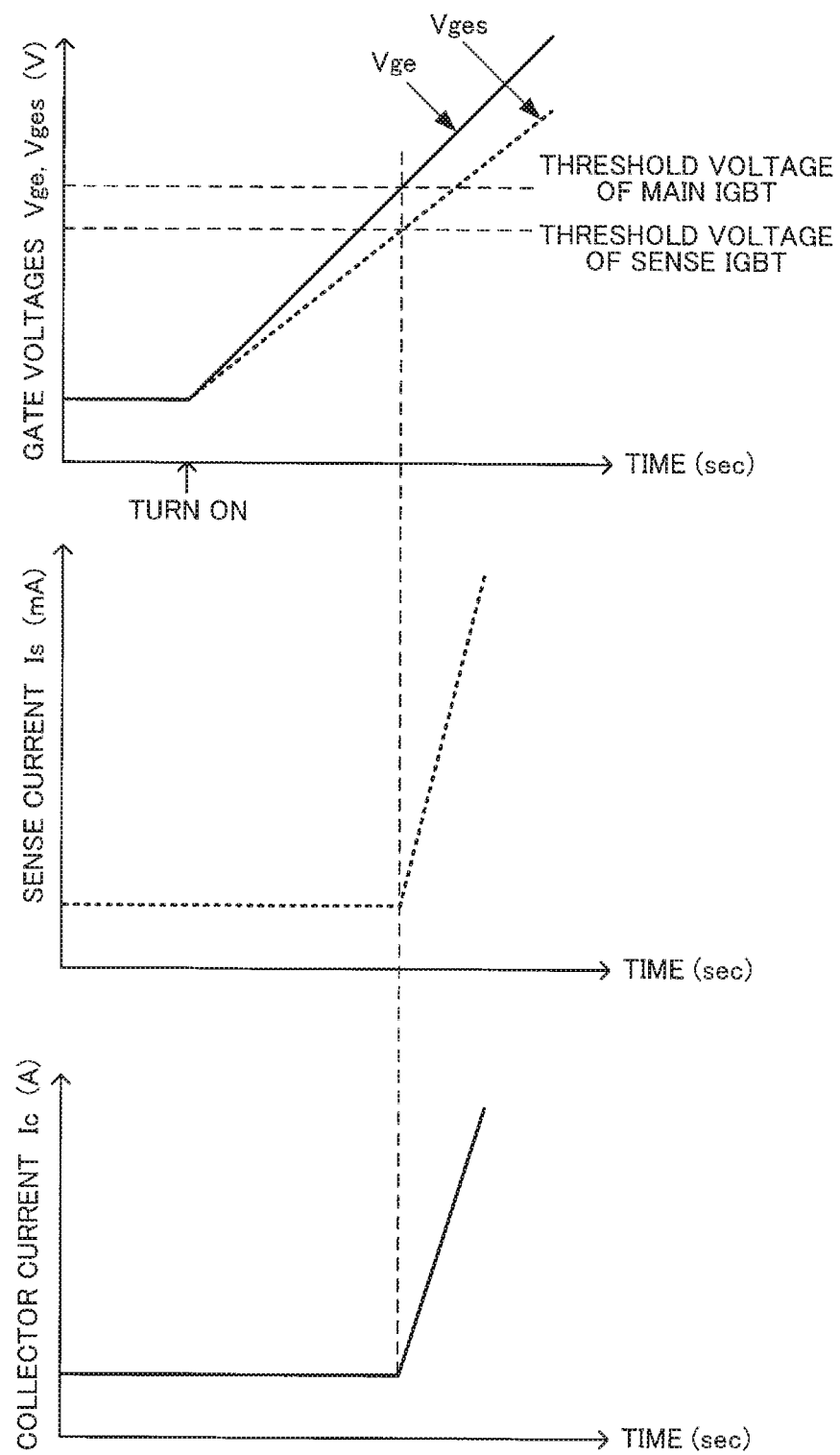
FIG. 3 illustrates the gate voltage waveform obtained by enlarging the A portion of FIG. 2, a sense current waveform, and a collector current waveform.

FIG. 2 illustrates gate voltage waveforms of the main IGBT and the sense IGBT which make up the IGBT according to the embodiment. FIG. 3 illustrates the gate voltage waveform obtained by enlarging the A portion of FIG. 2, a sense current waveform, and a collector current waveform. In FIG. 2, a vertical axis indicates gate voltages Vge and Vges of the main IGBT 11 and the sense IGBT 12 and a horizontal axis indicates time. In FIG. 3, a vertical axis of the top waveforms indicates gate voltages Vge and Vges of the main IGBT 11 and the sense IGBT 12, a vertical axis of the central waveform indicates a sense current Is of the sense IGBT 12, and a vertical axis of the bottom waveform indicates a collector current Ic of the main IGBT 11. In FIG. 3, a horizontal axis of each waveform indicates time.

Figure 4:
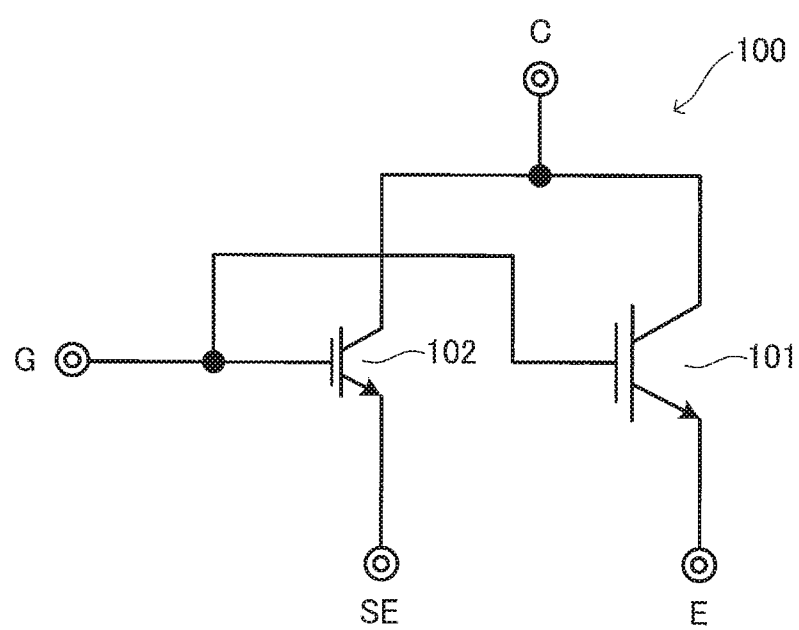
FIG. 4 is a circuit diagram illustrative of an IGBT having a structure for current detection.

When a gate voltage is applied to the gate terminal G and the turn-on operation of the IGBT 10 is begun, the gate voltage Vge of the main IGBT 11 and the gate voltage Vges of the sense IGBT 12 begin to rise. The threshold voltage of the sense IGBT 12 is lower than the threshold voltage of the main IGBT 11. Therefore, if the same voltage is applied to the gate terminals of the main IGBT 11 and the sense IGBT 12 (FIG. 4), then a current of the sense IGBT 12 and a current of the main IGBT 11 rise in that order.

With the IGBT 10 according to the embodiment the voltage division ratio of the voltage division resistors Rdiv1 and Rdiv2 is set so that when the gate voltage Vge of the main IGBT 11 becomes equal to the threshold voltage, the gate voltage Vges of the sense IGBT 12 becomes equal to the threshold voltage. Accordingly, at the time when the gate voltage Vge reaches the threshold voltage of the main IGBT 11 and the collector current Ic of the main IGBT 11 rises, the sense current Is of the sense IGBT 12 also rises. That is to say, a current of the sense IGBT 12 does not rise before a current of the main IGBT 11 rises. As a result, current concentration does not occur in the sense IGBT 12 and a transient sense current is suppressed.

In the above description the turn-on operation of the IGBT 10 has been described. However, the same effect is obtained in the turn-off operation of the IGBT 10. That is to say, when the gate voltage Vge of the main IGBT 11 falls below the threshold voltage at the time of the turn-off of the IGBT 10, the collector current Ic of the main IGBT 11 falls. At this point of time the gate voltage Vges of the sense IGBT 12 also falls below the threshold voltage. Therefore, when the IGBT 10 is turned off, current concentration does not occur in the sense IGBT 12.

In the above example IGBTs have been described as a main switching element and a sense switching element which make up a semiconductor device. However, MOS-FETs may be used in a semiconductor device in place of IGBTs.

With the semiconductor device having the above structure, a current flows through the main switching element. At this time a current also flows through the sense switching element. As a result, a period in which a short-circuit current is not detected does not exist. Furthermore, current concentration in the sense switching element is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a main switching element having a gate terminal and an emitter terminal;
   a sense switching element connected to the main switching element for detecting a current flowing through the main switching element; and
   a voltage division circuit connected between the gate terminal and the emitter terminal of the main switching element, the voltage division circuit including a first resistor and a second resistor connected in series, wherein a connection point of the first resistor and the second resistor is connected to the sense switching element, so that a voltage applied to the gate terminal of the main switching element is divided by the voltage division circuit, and a portion of the voltage is applied to the sense switching element.

2. The semiconductor device according to claim 1, wherein resistance values of the first resistor and the second resistor define a voltage division ratio, by which a gate voltage is generated to simultaneously on-drive the main switching element and the sense switching element.

3. The semiconductor device according to claim 2, wherein the voltage division ratio is set by performing trimming on at least one of the first resistor and the second resistor.

4. The semiconductor device according to claim 1, wherein each of the main switching element and the sense switching element is an insulated gate bipolar transistor (IGBT).

5. The semiconductor device according to claim 4, wherein
   the connection point of the first resistor and the second resistor is connected to a gate terminal of the sense switching element, and
   the portion of the voltage is applied to the gate terminal of the sense switching element.

* * * * *